(12) United States Patent
Shaw

(10) Patent No.: US 10,977,662 B2
(45) Date of Patent: Apr. 13, 2021

(54) METHODS AND SYSTEMS FOR SIMULATING AGENT BEHAVIOR IN A VIRTUAL ENVIRONMENT

(71) Applicant: RetailNext, Inc., San Jose, CA (US)

(72) Inventor: George Shaw, Palo Alto, CA (US)

(73) Assignee: RetailNext, Inc., San Jose, CA (US)

( * ) Notice: Subject to any disclaimer, the term of this patent is extended or adjusted under 35 U.S.C. 154(b) by 960 days.

(21) Appl. No.: 14/332,624

(22) Filed: Jul. 16, 2014

(65) Prior Publication Data

US 2015/0310447 A1 Oct. 29, 2015

Related U.S. Application Data

(60) Provisional application No. 61/985,294, filed on Apr. 28, 2014.

(51) Int. Cl.
*G06Q 30/00* (2012.01)
*G06Q 30/02* (2012.01)
*G06F 30/3308* (2020.01)

(52) U.S. Cl.
CPC ....... *G06Q 30/016* (2013.01); *G06F 30/3308* (2020.01); *G06Q 30/0201* (2013.01)

(58) Field of Classification Search
CPC .................................................... G06Q 30/00
USPC .......................................................... 705/1.1
See application file for complete search history.

(56) References Cited

U.S. PATENT DOCUMENTS

| | | | | |
|---|---|---|---|---|
| 7,778,863 B2* | 8/2010 | Yoshida | ........ | G06Q 30/02 705/7.31 |
| 7,835,936 B2* | 11/2010 | Ouimet | ........ | G06Q 30/0202 705/7.31 |
| 8,457,466 B1* | 6/2013 | Sharma | ........ | H04N 7/181 386/224 |
| 8,560,357 B2* | 10/2013 | Sickenius | ........ | G06Q 30/02 705/14.58 |
| 2003/0187708 A1* | 10/2003 | Baydar | ........ | G06Q 30/02 705/7.29 |
| 2007/0055563 A1* | 3/2007 | Godsey | ........ | G07G 1/0036 705/14.37 |

(Continued)

OTHER PUBLICATIONS

Wu, Supply chain risk management: An agent based simulation to study impact of retail stockout, 2013 (Year: 2013).*

*Primary Examiner* — Sangeeta Bahl
(74) *Attorney, Agent, or Firm* — Dergosits & Noah LLP; Todd A. Noah

(57) ABSTRACT

Systems and methods for simulating behavior of agents in a virtual environment are described. Observed customer behavior data for a retail space may be received. A model for customer behavior in the retail space is generated, the model including probabilities for customer responses to a plurality of stimuli. A virtual customer agent is built based on the model for customer behavior. A virtual retail space is built and modified, the modified virtual retail space including at least one different design feature from the virtual retail space. In the modified virtual retail space, the virtual customer agent is simulated performing a predetermined list of tasks based on the probabilities for the customer responses. Simulated customer behavior data, including responses of the virtual customer agent to the modified virtual retail space, may be generated based on the simulation.

17 Claims, 9 Drawing Sheets

(56) References Cited

U.S. PATENT DOCUMENTS

| | | | | |
|---|---|---|---|---|
| 2008/0043013 A1* | 2/2008 | Gruttadauria | ........... | G06Q 30/02 345/419 |
| 2008/0162262 A1* | 7/2008 | Perkins | ................ | G06Q 30/02 715/757 |
| 2010/0058183 A1* | 3/2010 | Hamilton, II | .......... | G06Q 30/02 715/706 |
| 2011/0169917 A1* | 7/2011 | Stephen | ............. | G06K 9/00785 348/46 |
| 2012/0089488 A1* | 4/2012 | Letchford | .............. | G06Q 30/02 705/27.2 |
| 2012/0223943 A1* | 9/2012 | Williams | ............... | G06Q 30/06 345/419 |
| 2013/0317950 A1* | 11/2013 | Abraham | ............... | G06Q 30/06 705/27.1 |

\* cited by examiner

METHODS AND SYSTEMS FOR SIMULATING AGENT BEHAVIOR IN A VIRTUAL ENVIRONMENT

CROSS-REFERENCE TO RELATED APPLICATIONS

This patent application claims priority to U.S. provisional patent application 61/985,294, filed Apr. 28, 2014 and entitled "Customer Simulation," which is incorporated herein in its entirety, along with all other references cited in this application.

FIELD OF THE INVENTION

The present invention relates to the field of information technology, including, more particularly, to systems and techniques for projecting virtual agent data in a virtual environment based on observed data.

BRIEF SUMMARY OF THE INVENTION

Systems and methods for simulating behavior of agents in a dynamic virtual environment are described. Using agents derived from real-world data on customer and associate paths, changes to a retail space may be implemented in a virtual representation of the retail space. The performance of agents may then be simulated in the modified virtual retail space, thereby generating data that is useful to the retail space operator when deciding whether or not to make changes to the retail space.

Observed customer behavior data for a retail space may be received by a processor. Based on the observed customer behavior, the processor may generate a model for customer behavior in the retail space, the model including probabilities for customer responses to a plurality of stimuli in the retail space. The processor may build a virtual customer agent based on the model for customer behavior and the processor may build a virtual retail space, the virtual retail space being a virtual representation of the retail space. The processor may then modify the virtual retail space, such that the modified virtual retail space includes at least one different design feature from the virtual retail space. In the modified virtual retail space, the processor may then simulate the virtual customer agent performing a predetermined list of tasks, the virtual customer agent's performance of each task being based on the probabilities for the customer responses contained in the model for customer behavior. Simulated customer behavior data may accordingly be generated based on the simulating the virtual customer agent performing the predetermined list of tasks. The simulated customer behavior data may include responses of the virtual customer agent to the modified virtual retail space.

Other objects, features, and advantages of the present invention will become apparent upon consideration of the following detailed description and the accompanying drawings, in which like reference designations represent like features throughout the figures.

DETAILED DESCRIPTION

Figure 1:
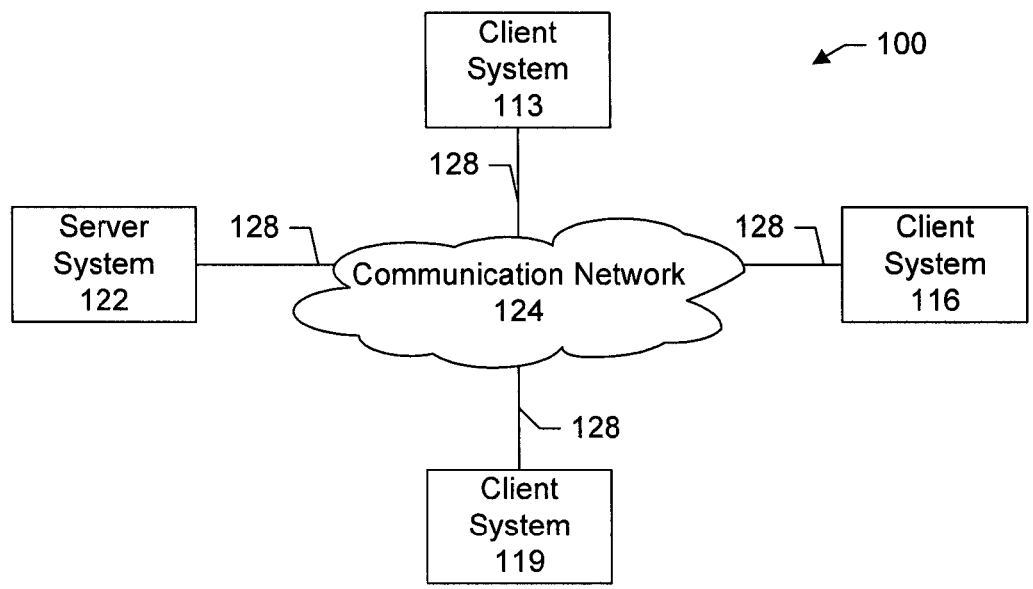
FIG. 1 shows a block diagram of a client-server system and network in which an embodiment of the invention may be implemented.

FIG. 1 is a simplified block diagram of a distributed computer network 100. Computer network 100 includes a number of client systems 113, 116, and 119, and a server system 122 coupled to a communication network 124 via a plurality of communication links 128. There may be any number of clients and servers in a system. Communication network 124 provides a mechanism for allowing the various components of distributed network 100 to communicate and exchange information with each other.

Communication network 124 may itself be comprised of many interconnected computer systems and communication links. Communication links 128 may be hardwire links, optical links, satellite or other wireless communications links, wave propagation links, or any other mechanisms for communication of information. Various communication protocols may be used to facilitate communication between the various systems shown in FIG. 1. These communication protocols may include TCP/IP, HTTP protocols, wireless application protocol (WAP), vendor-specific protocols, customized protocols, and others. While in one embodiment, communication network 124 is the Internet, in other embodiments, communication network 124 may be any suitable communication network including a local area network (LAN), a wide area network (WAN), a wireless network, a intranet, a private network, a public network, a switched network, and combinations of these, and the like.

Distributed computer network 100 in FIG. 1 is merely illustrative of an embodiment and is not intended to limit the scope of the invention as recited in the claims. One of ordinary skill in the art would recognize other variations, modifications, and alternatives. For example, more than one server system 122 may be connected to communication network 124. As another example, a number of client systems 113, 116, and 119 may be coupled to communication network 124 via an access provider (not shown) or via some other server system.

Client systems 113, 116, and 119 enable users to access and query information stored by server system 122. In a specific embodiment, a "Web browser" application executing on a client system enables users to select, access, retrieve, or query information stored by server system 122. Examples of web browsers include the Internet Explorer® browser program provided by Microsoft® Corporation, and the Firefox® browser provided by Mozilla® Foundation, and others.

Figure 2:
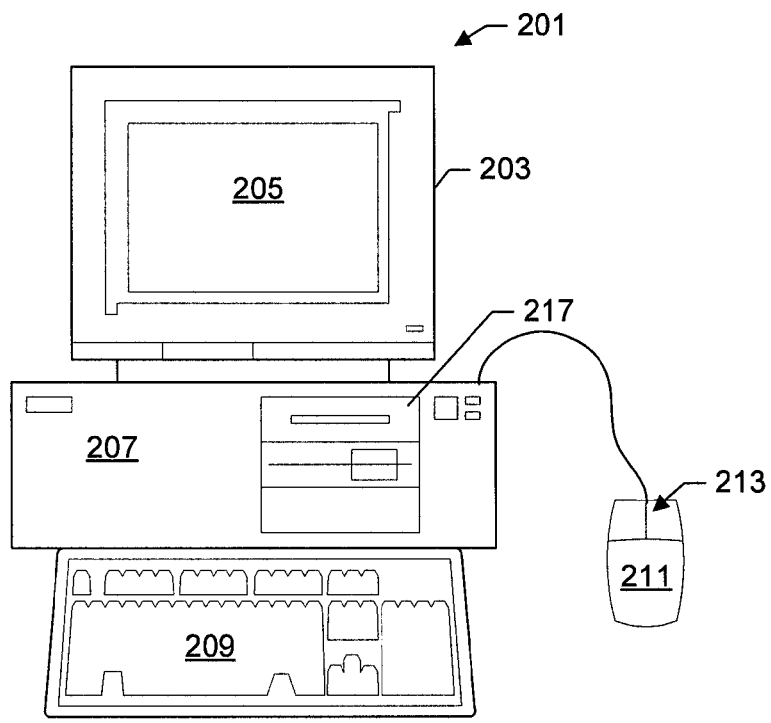
FIG. 2 shows a more detailed diagram of an example client or computer which may be used in an implementation of the invention, under an embodiment.

FIG. 2 shows an example client or server system. In an embodiment, a user interfaces with the system through a computer workstation system, such as shown in FIG. 2. FIG. 2 shows a computer system 201 that includes a monitor 203, screen 205, cabinet 207, keyboard 209, and mouse 211. Mouse 211 may have one or more buttons such as mouse buttons 213. Cabinet 207 houses familiar computer components, some of which are not shown, such as a processor, memory, mass storage devices 217, and the like.

Mass storage devices 217 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc®), flash and other nonvolatile solid-state storage (e.g., USB flash drive), battery-backed-up volatile memory, tape storage, reader, and other similar media, and combinations of these.

A computer-implemented or computer-executable version of the invention may be embodied using, stored on, or associated with computer-readable medium or non-transitory computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on mass storage device 217. The source code of the software may also be stored or reside on mass storage device 217 (e.g., hard disk, magnetic disk, tape, or CD-ROM). As a further example, code may be transmitted via wires, radio waves, or through a network such as the Internet.

Figure 3:
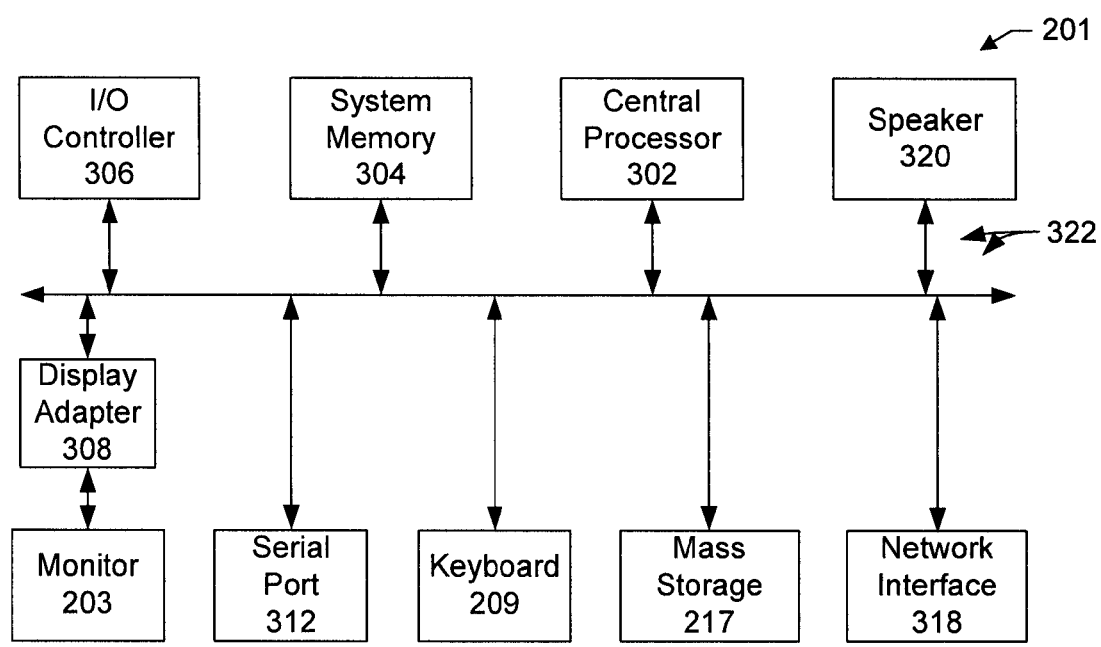
FIG. 3 shows a system block diagram of a client computer system, under an embodiment.

FIG. 3 shows a system block diagram of computer system 201. As in FIG. 2, computer system 201 includes monitor 203, keyboard 209, and mass storage devices 217. Computer system 201 further includes subsystems such as central processor 302, system memory 304, input/output (I/O) controller 306, display adapter 308, serial or universal serial bus (USB) port 312, network interface 318, and speaker 320. In an embodiment, a computer system includes additional or fewer subsystems. For example, a computer system could include more than one processor 302 (i.e., a multiprocessor system) or a system may include a cache memory.

Arrows such as 322 represent the system bus architecture of computer system 201. However, these arrows are illustrative of any interconnection scheme serving to link the subsystems. For example, speaker 320 could be connected to the other subsystems through a port or have an internal direct connection to central processor 302. The processor may include multiple processors or a multicore processor, which may permit parallel processing of information. Computer system 201 shown in FIG. 2 is but an example of a suitable computer system. Other configurations of subsystems suitable for use will be readily apparent to one of ordinary skill in the art.

Computer software products may be written in any of various suitable programming languages, such as C, C++, C#, Pascal, Fortran, Perl, Matlab® (from MathWorks), SAS, SPSS, JavaScript®, AJAX, Java®, SQL, and XQuery (a query language that is designed to process data from XML files or any data source that can be viewed as XML, HTML, or both). The computer software product may be an independent application with data input and data display modules. Alternatively, the computer software products may be classes that may be instantiated as distributed objects. The computer software products may also be component software such as Java Beans® (from Oracle Corporation) or Enterprise Java Beans® (EJB from Oracle Corporation). In a specific embodiment, the present invention provides a computer program product which stores instructions such as computer code to program a computer to perform any of the processes or techniques described.

An operating system for the system may be one of the Microsoft Windows® family of operating systems (e.g., Windows 95®, 98, Me, Windows NT®, Windows 2000®, Windows XP®, Windows XP® x64 Edition, Windows Vista®, Windows 7®, Windows CE®, Windows Mobile®), Linux, HP-UX, UNIX, Sun OS®, Solaris®, Mac OS X, Alpha OS®, AIX, IRIX32, or IRIX64. Other operating systems may be used. Microsoft Windows® is a trademark of Microsoft® Corporation.

Furthermore, the computer may be connected to a network and may interface to other computers using this network. The network may be an intranet, internet, or the Internet, among others. The network may be a wired network (e.g., using copper), telephone network, packet network, an optical network (e.g., using optical fiber), or a wireless network, or any combination of these. For example, data and other information may be passed between the computer and components (or steps) of the system using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

In an embodiment, with a Web browser executing on a computer workstation system, a user accesses a system on the World Wide Web (WWW) through a network such as the Internet. The Web browser is used to download web pages or other content in various formats including HTML, XML, text, PDF, and postscript, and may be used to upload information to other parts of the system. The Web browser may use uniform resource identifiers (URLs) to identify resources on the Web and hypertext transfer protocol (HTTP) in transferring files on the Web.

Figure 4:
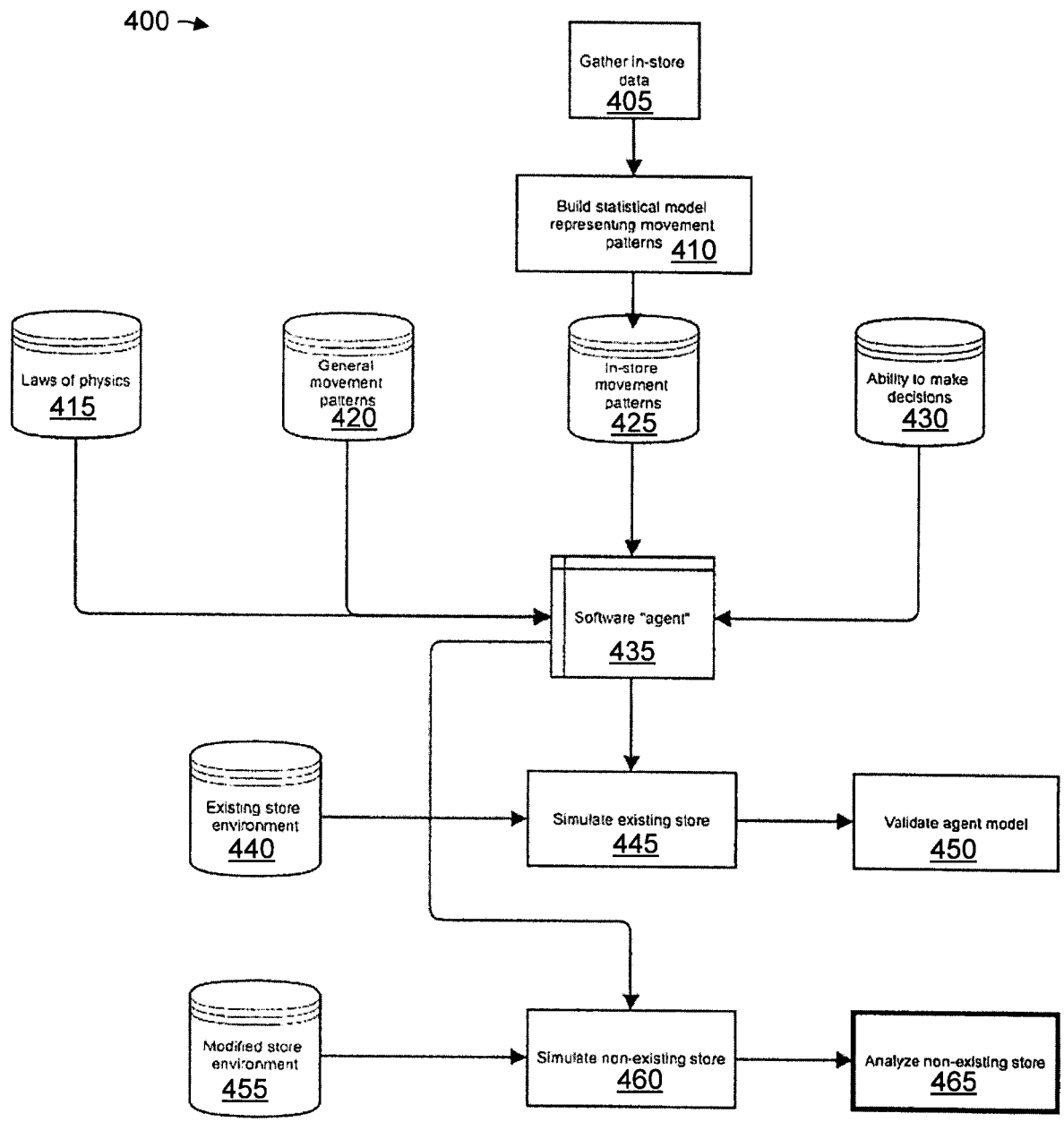
FIG. 4 shows a block diagram of an environment incorporating a system for simulating agent behavior in a virtual environment, under an embodiment.

FIG. 4 shows a block diagram of an environment incorporating a system 400 for simulating agent behavior in a virtual environment, under an embodiment. Block 405 may include gathering observed, in-store customer behavior data for a retail space. The observed customer behavior data may be gathered by observing customers for a predetermined period of time in the retail space. The observing may include generating data based on observed customer responses to the plurality of stimuli in the retail space. A statistical model representing movement patterns is generated from the in-store data at block 410. The statistical model may include probabilities for the customer responses to a plurality of stimuli included in the retail space. The stimuli may include placement of items, the layout of the retail space's fixed pieces (e.g., furniture, display cases, registers, and the like), and any other aspect of the retail space that the agent may interact with. The in-store movement patterns may be stored in database 425. Details of generating such a statistical model representing agent movement patterns are described in U.S. patent application Ser. No. 13/793,387, filed Jan. 25, 2013, which is hereby incorporated in full by this reference along with all other references cited herein.

A software "agent," representing a customer or a store associate, may be built at block 435. The software agent may incorporate information from a plurality of sources, including laws of physics contained in database 415, general movement patterns for the specified agent contained in database 420, and the in-store movement patterns for the specified agent contained in database 425. While databases 415, 420, and 425 are shown separately in system 400, databases 415, 420, and 425 may be combined into a single database, or grouped in any suitable arrangement. The general movement patterns for the specified agent contained in database 420 may be derived from observed data from a plurality of retail stores. The generating the model for customer behavior in the retail space may further include, in such embodiments, probabilities for customer responses to a plurality of stimuli in the plurality of retail stores. The stimuli may be different from those in the retail space, thereby allowing for more accurate modeling in some embodiments.

Also, in some embodiments, the model for customer behavior in the retail space further may include an ability for the virtual customer agent to apply logical rules. The logical rules may be implemented as a machine intelligence with the ability to make decisions based on various stimuli within the retail space. The data providing the ability to make decisions may be stored in database 430, and may also be used to generate the software agent in block 435. The virtual customer agent's performance of each of a predetermined list of tasks may be further based on applying the logical rules to the particular task in view of the modified virtual retail space.

The retail space may be used to create and simulate a virtual retail space at block 445. The virtual retail space may be stored in database 440. The virtual retail space may be used to validate the software agent at block 450. The validating may include simulating, by a processor, a virtual customer agent performing a predetermined list of tasks in the virtual retail space. The virtual agent's performance may be based on the probabilities for the customer responses contained in the model for customer behavior. The processor may generate simulated customer behavior data for validation based on simulating the virtual customer agent performing the predetermined list of tasks in the virtual retail space. The simulated customer behavior data for validation may include responses of the virtual customer agent to the virtual retail space. The validation may also include comparing, by the processor, the simulated customer behavior data for validation with the observed customer behavior data to assess the quality of the model for customer behavior. In some embodiments, a metric may be generated that quantifies how closely the simulated customer behavior data for validation resembles the observed customer behavior data. The metric may be compared to a predetermined threshold value, and the model for customer behavior may be adjusted when the metric is less than the predetermined threshold value for the metric.

At block 460, a "non-existing," modified retail space may be simulated. To do so, a modified virtual retail space is generated and stored in database 455. As described below, the modified virtual retail space may include at least one different design feature from the virtual retail space, which substantially is a representation of the actual retail space. Different design features may include, for example, changing the size or layout of the virtual retail space, or moving the placement of items, or a department of items, for example. The behavior of the software agent in the modified virtual retail space may be analyzed in block 465, resulting in the generation of simulated data in the modified virtual retail space. Such data, which may include sales data, conversion for items, etc, may be useful to retail space operators, who may test changes to the actual retail space without making actual changes to the retail space.

In embodiments described herein, a retail space may be a "brick and mortar" business, and the subjects are people or human beings. For example, the subjects can include customers, consumers, or shoppers, salespersons, adults, children, toddlers, teenagers, females, males, and so forth. The retail space may be a grocery store, supermarket, clothing store, jewelry store, department store, discount store, warehouse store, variety store, mom-and-pop, specialty store, general store, convenience store, hardware store, pet store, toy store, or mall—just to name a few examples.

Observed customer behavior data may be imported from an external system such as point of sales (POS) device, an inventory management system, customer relationship management (CRM) system, financials system, warehousing system, or combinations of these. In a specific implementation, a retail metric includes conversion data or a conversion rate. A conversion can be expressed as a percentage of customers that enter the store and purchase a good, service, or both. The conversion can be calculated by dividing a number of sales transactions by a number of customers who enter the store. Conversion measures the amount of people who enter store versus the number of customers who make a purchase. Conversion helps to provide an indication of how effective the sales staff is at selling products and the number of customers visiting the store.

Conversions can be for any time period such as an hour, day, week, month, quarter (e.g., fall, winter, spring, or summer), year, and so forth. A conversion may be calculated for a particular day such as a weekday (e.g., Monday, Tuesday, Wednesday, Thursday, Friday, Saturday, or Sunday), a weekend (e.g., Friday, Saturday, or Sunday), a holiday (e.g., Columbus Day, Veterans Day, or Labor Day), the day following Thanksgiving (e.g., Black Friday), and so forth.

Some other examples of metrics include traffic to a particular location in the store (e.g., traffic past a particular display), engagement (e.g., measurement of how well sales staff is engaging customers), sales per square foot, comparable-store sales (e.g., year-over-year sales performance), average sale per customer or transaction, cost of goods sold, markup percentage, inventory to sales ratio, average age of inventory, wages paid to actual sales, customer retention (e.g., number of repeat purchases divided by number of first time purchases), product performance (e.g., ranked listing of products by sales revenue), sales growth (e.g., previous period sales revenue divided by current period sales revenue), demographic metrics (e.g., total revenue per age, sex, or location), sales per sales associate (e.g., actual sales per associate per time period), or average purchase value (e.g., total sales divided by number of sales)—just to name a few examples.

Figure 5:
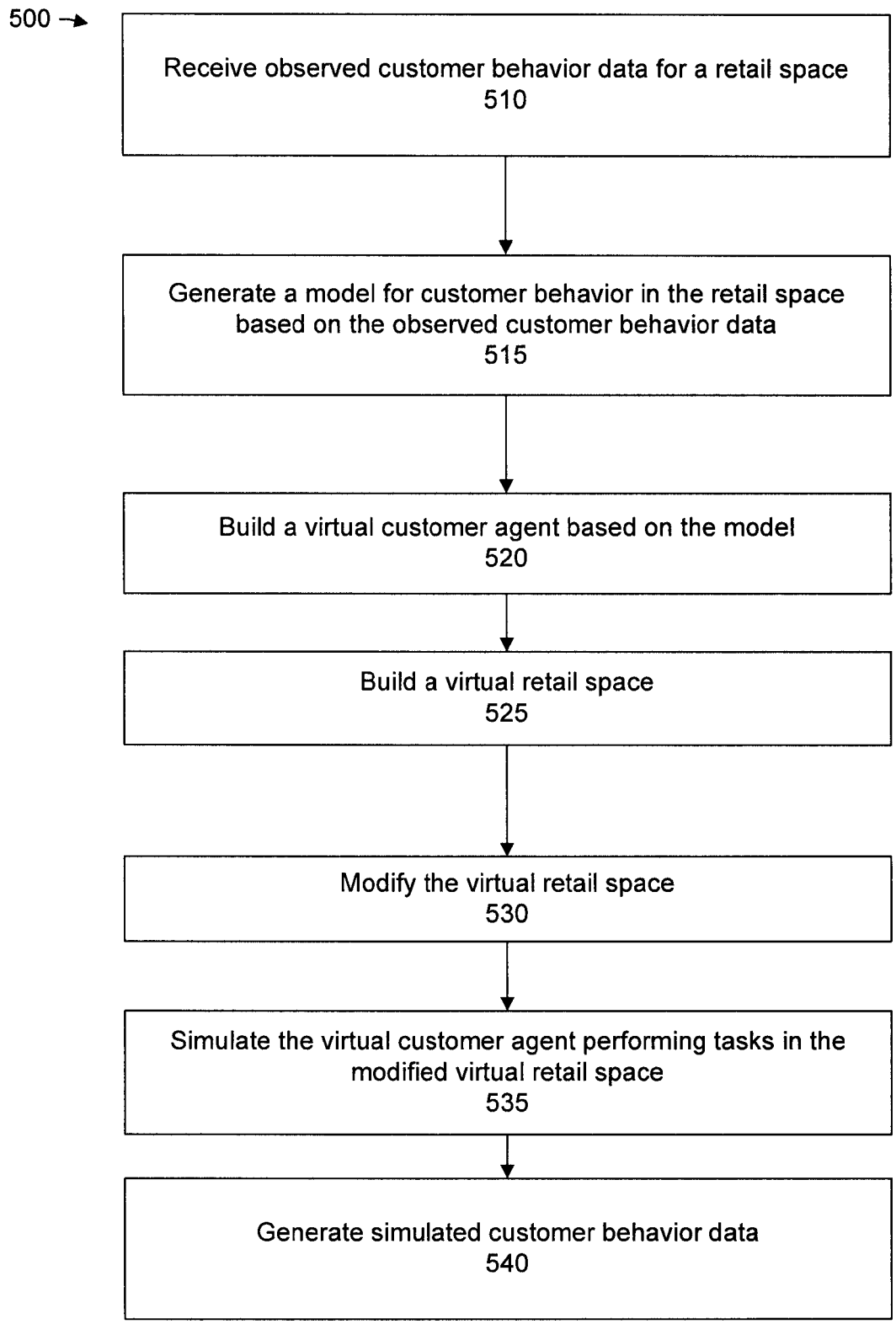
FIG. 5 shows an overall flow for simulating agent behavior in a virtual environment, under an embodiment.

FIG. 5 shows an overall flow 505 for quantifying customer movement patterns. Some specific flows are presented in this application, but it should be understood that the process is not limited to the specific flows and steps presented. For example, a flow may have additional steps (not necessarily described in this application), different steps which replace some of the steps presented, fewer steps or a subset of the steps presented, or steps in a different order than presented, or any combination of these. Further, the steps in other implementations may not be exactly the same as the steps presented and may be modified or altered as appropriate for a particular process, application or based on the data.

In a step 510, Observed customer behavior data for a retail space may be received by a processor. In a specific implementation, the customer behavior data includes an a collection of individual tracks, each individual track representing a single customer's path through the store as the person moves from camera view to camera view through the store. The collected tracks can be combined or aggregated for a macro analysis. U.S. patent application Ser. No. 13/603,832 (the '832 application), filed Sep. 5, 2012, which is incorporated by reference along with all other references cited in this patent application, describes techniques for obtaining a first subtrack of a customer captured by a first camera in the store, obtaining a second subtrack of the customer captured by a second camera in the store, and matching the first and second subtracks to join them together as a single track.

Based on the observed customer behavior, the processor may generate a model for customer behavior in the retail space at step 515. The model may include probabilities for customer responses to a plurality of stimuli in the retail space. The processor may build a virtual customer agent based on the model for customer behavior at step 520 and the processor may build a virtual retail space at step 525. The virtual retail space may be a virtual representation of the retail space.

The processor may then modify the virtual retail space at step 530, such that the modified virtual retail space includes at least one different design feature from the virtual retail space. In the modified virtual retail space, the processor may then simulate the virtual customer agent performing a predetermined list of tasks at step 540. The virtual customer agent's performance of each task may be based on the probabilities for the customer responses contained in the model for customer behavior. Simulated customer behavior data may accordingly be generated at step 540 based on the simulating the virtual customer agent performing the predetermined list of tasks. The simulated customer behavior data may include responses of the virtual customer agent to the modified virtual retail space.

While method 500 is described from the perspective of a virtual customer agent, other agents may be built and simulated. For example, observed associate behavior data for the retail space may be received, the associate being an employee working in the retail space. A model for associate behavior in the retail space may be generated based on the observed associate behavior, the model including probabilities for associate responses to the plurality of stimuli in the retail space. A virtual associate agent may be built based on the model for associate behavior. The virtual associate agent may be simulated to perform a predetermined list of tasks in the modified virtual retail space, the virtual associate agent's performance being based on the probabilities for the associate responses contained in the model for customer behavior. Accordingly simulated associate behavior data may be generated based on the simulating the virtual associate agent performing the predetermined list of tasks, the simulated associate behavior data comprising the responses of the virtual associate agent to the virtual retail space.

Figure 6:
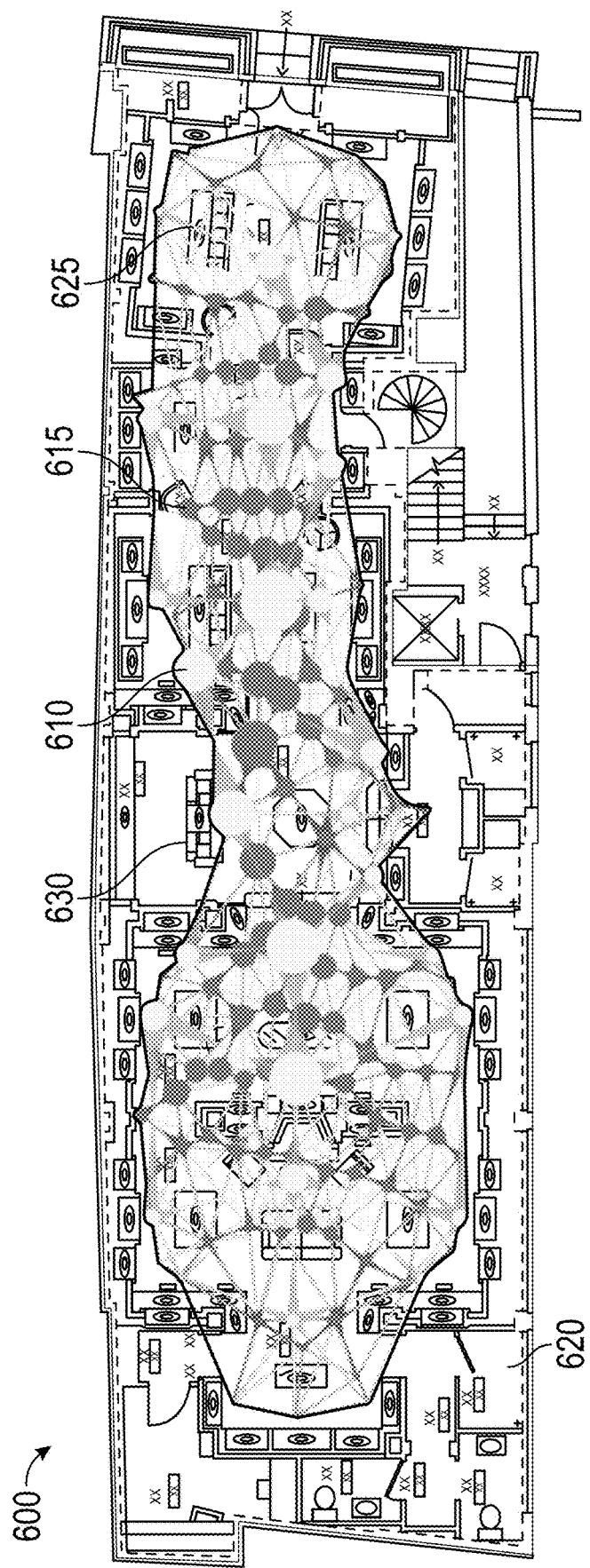
FIG. 6 shows a schematic of a statistical model of observed customer movement data, under an embodiment.

FIG. 6 shows a schematic of a statistical model 600 of observed customer movement data in a virtual retail space 620, under an embodiment. The statistical model 600 may be used to capture and quantify existing customer movement data. Nodes 610 and 615 may be used, with transitions from node to node derived from customer paths (see reference to nodes to quantify movement data in U.S. patent application Ser. No. 13/793,387, filed Jan. 25, 2013, and incorporated herein by reference). The model may operate at several spatial scales under certain embodiments. For example, up to five spatial scales may be used to capture granular movement (i.e., changes in direction, flow within a room, etc), product-level movement (i.e., fixture to fixture), and macro movement (i.e., department to department or room to room). Shown in model 600 are two exemplary spatial scales, differentiated by light nodes 610 and dark nodes 615.

Figure 7:
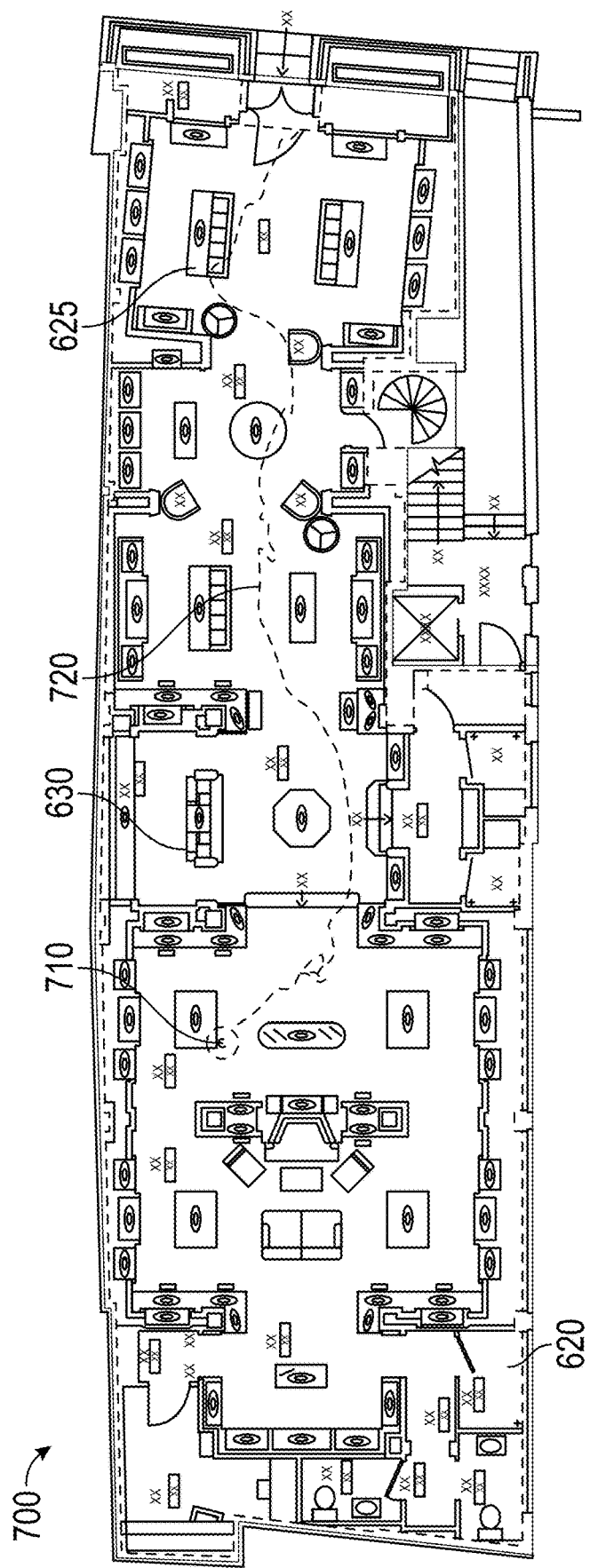
FIG. 7 shows a simulated customer in a virtual retail space, under an embodiment.

FIG. 7 shows a statistical model 700 of a simulated customer 710 in a virtual retail space 620, under an embodiment. Simulated customer 710 may be a virtual customer agent, built as described above. The simulated customer may be trained on real data (see description of models above with respect to FIG. 6). The simulated customer 710 may be allowed to move through the virtual retail space 620 autonomously and interact with stimuli 625 and 630 upon entering the virtual retail space 620. In accordance with method 500, the simulated customer 710 may execute a predetermined list of tasks, and in doing so, may take the path 720 indicated in the statistical model 700. The path 720 may be dictated by probabilities for the simulated customer responses to, for example a particular task (e.g., locate and purchase socks from the virtual retail space 620), as well as probabilities for the simulated customer response to each of stimuli 625 and 630.

Figure 8:
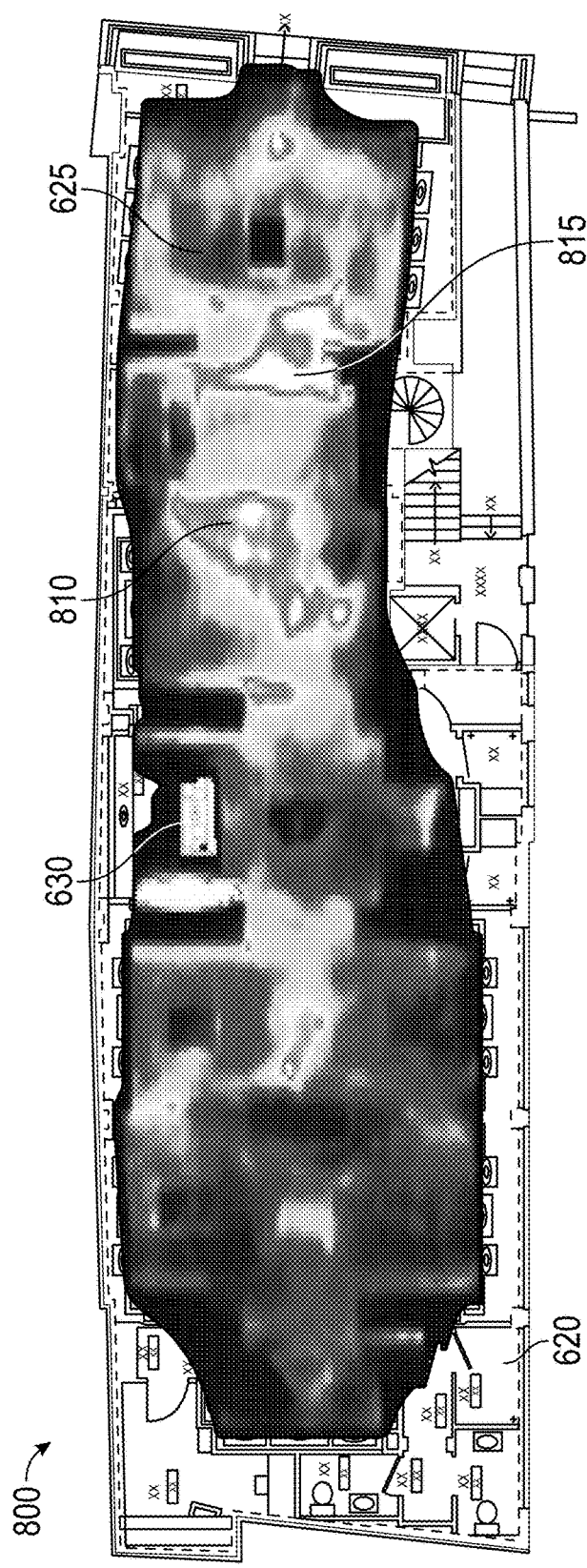
FIG. 8 shows a heat map for observed customer movement data in a virtual retail space, under an embodiment.

FIG. 8 shows a heat map 800 for simulated customer movement data in a virtual retail space 620, under an embodiment. Lighter shaded areas, such as 810 and 820, represent simulated high customer density in the retail space. This heatmap (or "kinetic map") shows the equivalent of a day of movement data. Other predetermined time periods may be used. Heat map 800 is a visualization of a spatial histogram. The visualization can be compared visually to an equivalent day of observed (i.e., "real" data from the retail space) data as part of the validation described above. The spatial histogram corresponding to the heat map 800 can be compared mathematically to an equivalent spatial histogram generated by observed customer behavior data as part of the validation as well (see U.S. patent application Ser. No. 13/793,387, filed Jan. 25, 2013, and incorporated herein by reference, for comparison of spatial histograms).

Figure 9:
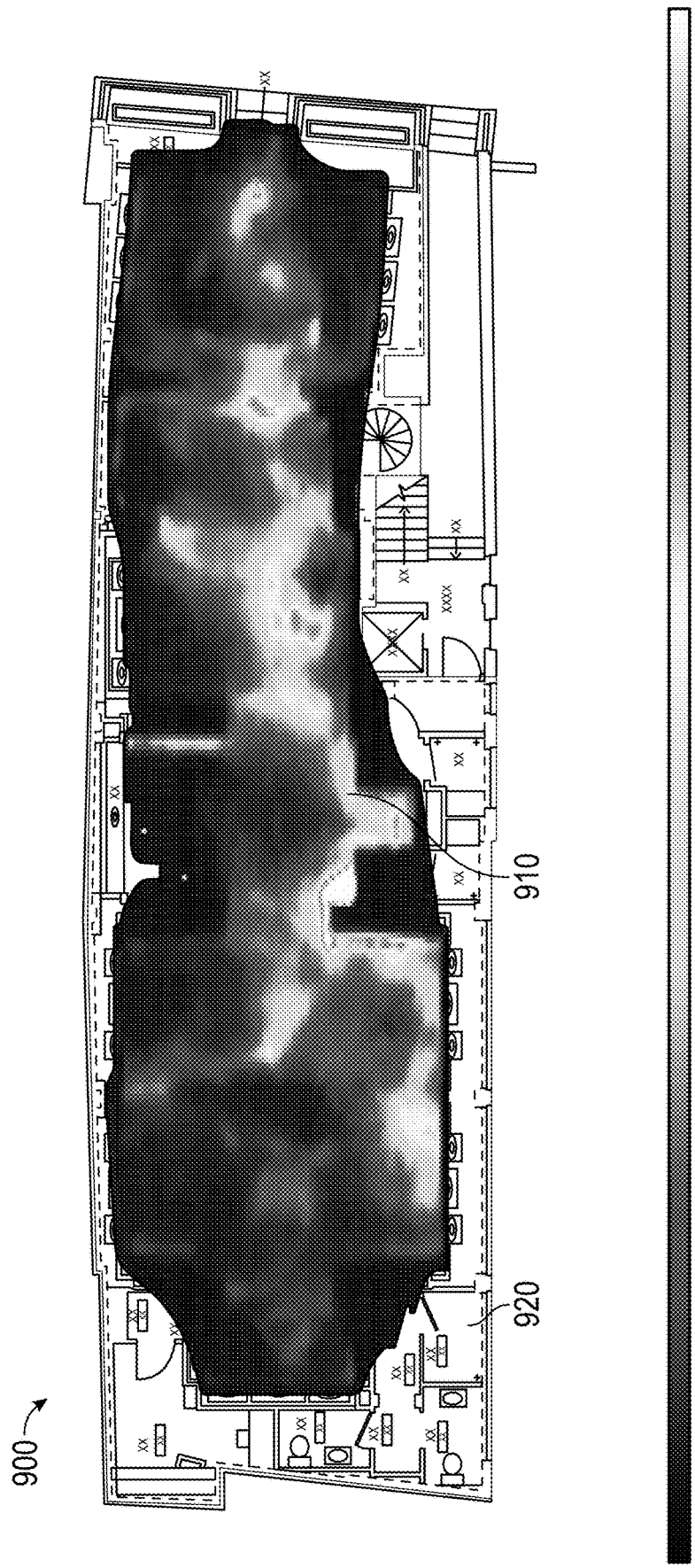
FIG. 9 shows a heat map for simulated customer movement data in a modified virtual retail space, under an embodiment.

FIG. 9 shows a heat map 900 for simulated customer movement data in a modified virtual retail space 920, under an embodiment. In this example of "making changes," the virtual customer agent has been trained a simulation on real data. The nodes representing product locations have been moved in modified virtual retail space 920 such that all of the top selling items are located the left side of the store. Micro-movements and macromovements are similar to those in FIG. 7, however product-level movements 910 favor the left side of the store overwhelmingly. This is meant merely as an example to illustrate the approach. Another exemplary application would be to explore many different merchandise configurations to see which creates the most desirable flow patterns—ie "does this layout drive traffic past my high-margin items?"

Figure 10:
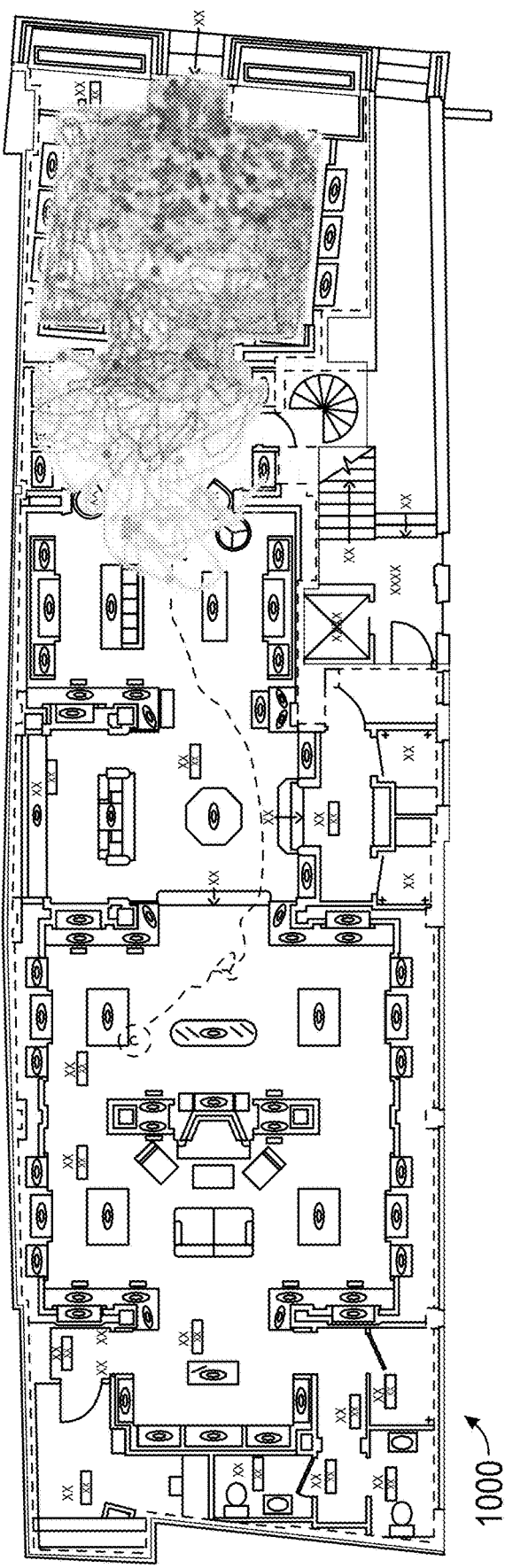
FIG. 10 shows an example of customer flow patterns in a high traffic scenario.

FIG. 10 shows an example of customer flow patterns in a high-traffic scenario. This second example of "making changes" shows customer flow patterns in an abnormally high traffic scenario. Every 5 seconds a new group of 20 customers enters the store and attempts to shop normally. The example shows the effect of overwhelming congestion on shopping behavior. By simulating the high-traffic scenario, a retailer may see that a current retail space configuration will not work optimally, leading to crowding and discouraging customers from shopping. The retailer may then adjust the virtual retail space to find a better retail space configuration for times when high traffic is expected (e.g., during the holidays, or during a particular sales promotion).

In the description above and throughout, numerous specific details are set forth in order to provide a thorough understanding of an embodiment of this disclosure. It will be evident, however, to one of ordinary skill in the art, that an embodiment may be practiced without these specific details. In other instances, well-known structures and devices are shown in block diagram form to facilitate explanation. The description of the preferred embodiments is not intended to limit the scope of the claims appended hereto. Further, in the methods disclosed herein, various steps are disclosed illustrating some of the functions of an embodiment. These steps are merely examples, and are not meant to be limiting in any way. Other steps and functions may be contemplated without departing from this disclosure or the scope of an embodiment.

What is claimed is:

1. A method comprising:
   receiving, by a processor, observed customer behavior data for a retail space;
   generating, by the processor, a model for customer behavior in the retail space based on the observed customer behavior data, the model comprising probabilities for customer responses to one or more of a plurality of retail space stimuli during performance of one or more tasks from a plurality of tasks in the retail space;
   building, by the processor, a virtual customer agent having movement patterns based on applying to the virtual customer agent, the probabilities for customer responses and one or more first logical decision rules that decide a response of the virtual customer agent based on one or more retail space stimuli during simulated performance of one or more tasks;
   building, by the processor, a virtual retail space, the virtual retail space being a virtual representation of the retail space;
   simulating, by the processor, a first movement pattern for the virtual customer agent performing a first predetermined list of tasks in the virtual retail space with respect to the probabilities for customer responses and one or more of the first logical decision rules that correspond to retail space stimuli;
   causing display on an interface, by the processor, of the virtual retail space, the virtual customer agent, and a path based on the first movement pattern for the virtual customer agent;
   modifying, by the processor, the virtual retail space to generate a modified virtual retail space with at least one different physical retail space design feature from the virtual retail space;
   causing, by the processor, to simulate a second movement pattern for the virtual customer agent performing the same first predetermined list of tasks in the modified virtual retail space with respect to the probabilities for customer responses, the one or more of the first logical decision rules that correspond to the same retail space stimuli and the at least one different physical retail space design feature of the modified virtual retail space; and
   causing, by the processor, display of simulated customer behavior data on the interface, the simulated customer behavior data comprising, in part, one or more of the customer responses applied by the virtual customer agent during the second movement pattern.

2. The method of claim 1, further comprising:
   receiving, by the processor, observed associate behavior data for the retail space, the associate being an employee working in the retail space;
   generating, by the processor, a model for associate behavior in the retail space based on the observed associate behavior data, the model comprising probabilities for associate responses to the one or more of the plurality of retail space stimuli;
   building, by the processor, a virtual associate agent based on applying to the virtual associate agent: the probabilities for associate responses and one or more second logical decision rules that correspond to one or more retail space stimuli during simulated performance of one or more associate tasks;
   simulating, by the processor, the virtual associate agent performing a second predetermined list of associate tasks in the modified virtual retail space having the at least one different physical retail space design feature with respect to the probabilities for associate responses and one or more of the second logical decision rules that correspond to retail space stimuli; and
   storing, by the processor, simulated associate behavior data comprising, in part, one or more of the associate responses applied by the virtual associate agent during performance of the second predetermined list of associate tasks in the modified virtual retail space.

3. The method of claim 1, wherein the observed customer behavior data is gathered by observing customers for a predetermined period of time in the retail space, the observing comprising generating data based on observed customer responses to one or more of a plurality of actual retail space stimuli.

4. The method of claim 1 wherein the at least one different physical retail space design feature includes:
   a change to a size of the virtual retail space.

5. The method of claim 1 wherein the at least one different physical retail space design feature includes:
   an adjustment to a location of a product within the virtual retail space.

6. The method of claim 1, wherein the simulated customer behavior data includes simulated sales data.

7. The method of claim 1, wherein the received observed customer behavior data further comprises:
   observed customer behavior data from a plurality of retail stores, wherein each of the retail stores in the plurality of retail stores share a common feature with the retail space; and
   wherein generating the model for customer behavior in the retail space further comprises: additional probabilities for customer responses to one or more of the plurality of retail space stimuli in the plurality of retail stores.

8. The method of claim 7, wherein the plurality of stimuli in the plurality of retail stores comprises:
   one or more additional retail space stimuli absent from the retail space.

9. The method of claim 7, wherein the observed customer behavior data from the plurality of retail stores comprises:
   one or more suggested layouts for a respective retail space from the plurality of retail stores based on at least one sale of an item and at least one conversion of the item.

10. The method of claim 1, wherein the model for customer behavior in the retail space further comprises:

one or more limitations on the virtual customer agent based on at least one of the laws of physics.

11. A non-transitory computer readable storage medium having embodied thereon a program, the program being executable by a processor, the method comprising:

receiving observed customer behavior data for a retail space;

generating a model for customer behavior in the retail space based on the observed customer behavior data, the model comprising probabilities for customer responses to one or more of a plurality of retail space stimuli during performance of one or more tasks from a plurality of tasks in the retail space;

building a virtual customer agent having movement patterns based on applying, to the virtual customer agent, the probabilities for customer responses and one or more first logical decision rules that decide a response of the virtual customer agent based on one or more retail space stimuli during simulated performance of one or more tasks;

building a virtual retail space, the virtual retail space being a virtual representation of the retail space;

simulating a first movement pattern for the virtual customer agent performing a first predetermined list of tasks in the virtual retail space with respect to the probabilities for customer responses and one or more of the first logical decision rules that correspond to retail space stimuli;

displaying the virtual retail space, the virtual customer agent, and a path based on the first movement pattern for the virtual customer agent to be displayed on an interface;

modifying the virtual retail space to generate a modified virtual retail space with at least one different physical retail space design feature from the virtual retail space;

simulating a second movement pattern for the virtual customer agent performing the same first predetermined list of tasks in the modified virtual retail space with respect to the probabilities for customer responses, the one or more of the first logical decision rules that correspond to the same retail space stimuli and the at least one different physical retail space design feature of the modified virtual retail space; and displaying simulated customer behavior data on the interface, the simulated customer behavior data comprising, in part, one or more of the customer responses applied by the virtual customer agent during the second movement pattern.

12. The non-transitory computer readable storage medium of claim 11, the method further comprising:

receiving observed associate behavior data for the retail space, the associate being an employee working in the retail space;

generating a model for associate behavior in the retail space based on the observed associate behavior data, the model comprising probabilities for associate responses to the one or more of the plurality of retail space stimuli;

building a virtual associate agent based on to the virtual associate agent: the probabilities for associate responses and one or more second logical decision rules that correspond to one or more retail space stimuli during simulated performance of one or more associate tasks;

simulating the virtual associate agent performing a second predetermined list of associate tasks in the modified virtual retail space having the at least one different physical retail space design feature with respect to the probabilities for associate responses and one or more of the second logical decision rules that correspond to retail space stimuli; and storing simulated associate behavior data comprising, in part, one or more of the associate responses applied by the virtual associate agent during performance of the second predetermined list of associate tasks in the modified virtual retail space.

13. The non-transitory computer readable storage medium of claim 11, wherein the observed customer behavior data is gathered by observing customers for a predetermined period of time in the retail space, the observing comprising generating data based on observed customer responses to one or more of a plurality of actual retail space stimuli.

14. The non-transitory computer readable storage medium of claim 11, wherein the at least one different physical retail space design feature includes:

a change to a size of the virtual retail space.

15. The non-transitory computer readable storage medium of claim 11, wherein the at least one different physical retail space design feature includes:

an adjustment to a location of a product within the virtual retail space.

16. The non-transitory computer readable storage medium of claim 11, wherein the simulated customer behavior data includes simulated sales data.

17. The non-transitory computer readable storage medium of claim 11, wherein the received observed customer behavior data comprises:

observed customer behavior data from a plurality of retail stores, wherein each of the retail stores in the plurality of retail stores share a common feature with the retail space; and wherein generating the model for customer behavior in the retail space further comprises: additional probabilities for customer responses to one or more of the plurality of retail space stimuli in the plurality of retail stores.

* * * * *